United States Patent
Lin et al.

(10) Patent No.: US 7,050,316 B1
(45) Date of Patent: May 23, 2006

(54) DIFFERENTIAL NON-VOLATILE CONTENT ADDRESSABLE MEMORY CELL AND ARRAY USING PHASE CHANGING RESISTOR STORAGE ELEMENTS

(75) Inventors: Ya-Fen Lin, Santa Clara, CA (US); Elbert Lin, Fremont, CA (US); Dana Lee, Santa Clara, CA (US); Bomy Chen, Cupertino, CA (US); Hung Q. Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/797,207

(22) Filed: Mar. 9, 2004

(51) Int. Cl.
*G11C 15/00* (2006.01)

(52) U.S. Cl. .......................................... 365/49; 365/175
(58) Field of Classification Search .................. 365/49, 365/115, 168, 175, 189.07
See application file for complete search history.

(56) References Cited

U.S. PATENT DOCUMENTS

| | | | |
|---|---|---|---|
| 5,029,130 A | 7/1991 | Yeh | |
| 5,930,161 A | 7/1999 | Sheikholeslami et al. | |
| 5,949,696 A | 9/1999 | Threewitt | |
| 6,411,538 B1 * | 6/2002 | Kengeri | 365/49 |
| 6,452,823 B1 * | 9/2002 | Naji | 365/50 |
| 6,639,818 B1 | 10/2003 | Nojima | |
| 6,751,110 B1 * | 6/2004 | Hu | 365/49 |

* cited by examiner

*Primary Examiner*—Gene N. Auduong
(74) *Attorney, Agent, or Firm*—DLA Piper Rudnick Gray Cary US LLP

(57) ABSTRACT

A differential sensing content addressable memory cell without any word lines connected to the cells in the same row comprises a first bit line for supplying a first bit. A first storage element has a first phase change resistor for storing a first stored bit, which is connected in series with a first diode. The first storage element is connected to the first bit line. A second bit line supplies a second bit, with the second bit being an inverse of the first bit. A second storage element has a second phase change resistor for storing a second stored bit, which is connected in series with a second diode. The second storage element is connected to the second bit line. A match line is connected to the first and second storage elements for indicating whether a match occurred between the first bit and the first stored bit, and between the second bit and the second stored bit

10 Claims, 3 Drawing Sheets

DIFFERENTIAL NON-VOLATILE CONTENT ADDRESSABLE MEMORY CELL AND ARRAY USING PHASE CHANGING RESISTOR STORAGE ELEMENTS

TECHNICAL FIELD

The present invention relates to a non-volatile differential content addressable memory cell using a phase changing resistor such as a chalcogenide storage element and an array. As a result memory cells in the same row do not require a word line to query the cells.

BACKGROUND OF THE INVENTION

Content addressable memory cells and arrays are well known in the art. U.S. Pat. No. 5,949,696 discloses a differential volatile content addressable memory cell and an array made thereby.

Non-volatile content addressable memory cells and arrays are also well known in the art. U.S. Pat. No. 5,930,161 discloses a non-volatile content addressable memory cell and array using ferroelectric capacitors as storage elements.

Non-volatile floating gate storage elements are also well known in the art. These can be of the stacked gate type or the split gate type as exemplified by U.S. Pat. No. 5,029,130.

A differential non-volatile content addressable memory cell comprising a pair of nonvolatile storage elements, and an array is also shown in U.S. Pat. No. 6,639,818.

However, heretofore, all non-volatile differential content addressable memory cells and array have used a word line through the cells that are arranged in the same row to activate those cells.

Phase changing resistors, such as chalcogenide storage elements are also well known in the art.

It is therefore, an object of the present invention to provide a non-volatile differential content addressable memory without the use of word lines.

SUMMARY OF THE INVENTION

Accordingly, in the present invention, a content addressable memory cell comprises a first bit line for supplying a first bit. A first storage element has a first phase change resistor for storing a first stored bit, which is connected in series with a first diode. The first storage element is connected to the first bit line. A second bit line supplies a second bit, with the second bit being an inverse of the first bit. A second storage element has a second phase change resistor for storing a second stored bit, which is connected in series with a second diode. The second storage element is connected to the second bit line. A match line is connected to the first and second storage elements for indicating whether a match occurred between the first bit and the first stored bit, and between the second bit and the second stored bit.

DETAILED DESCRIPTION OF THE INVENTION

Figure 1:
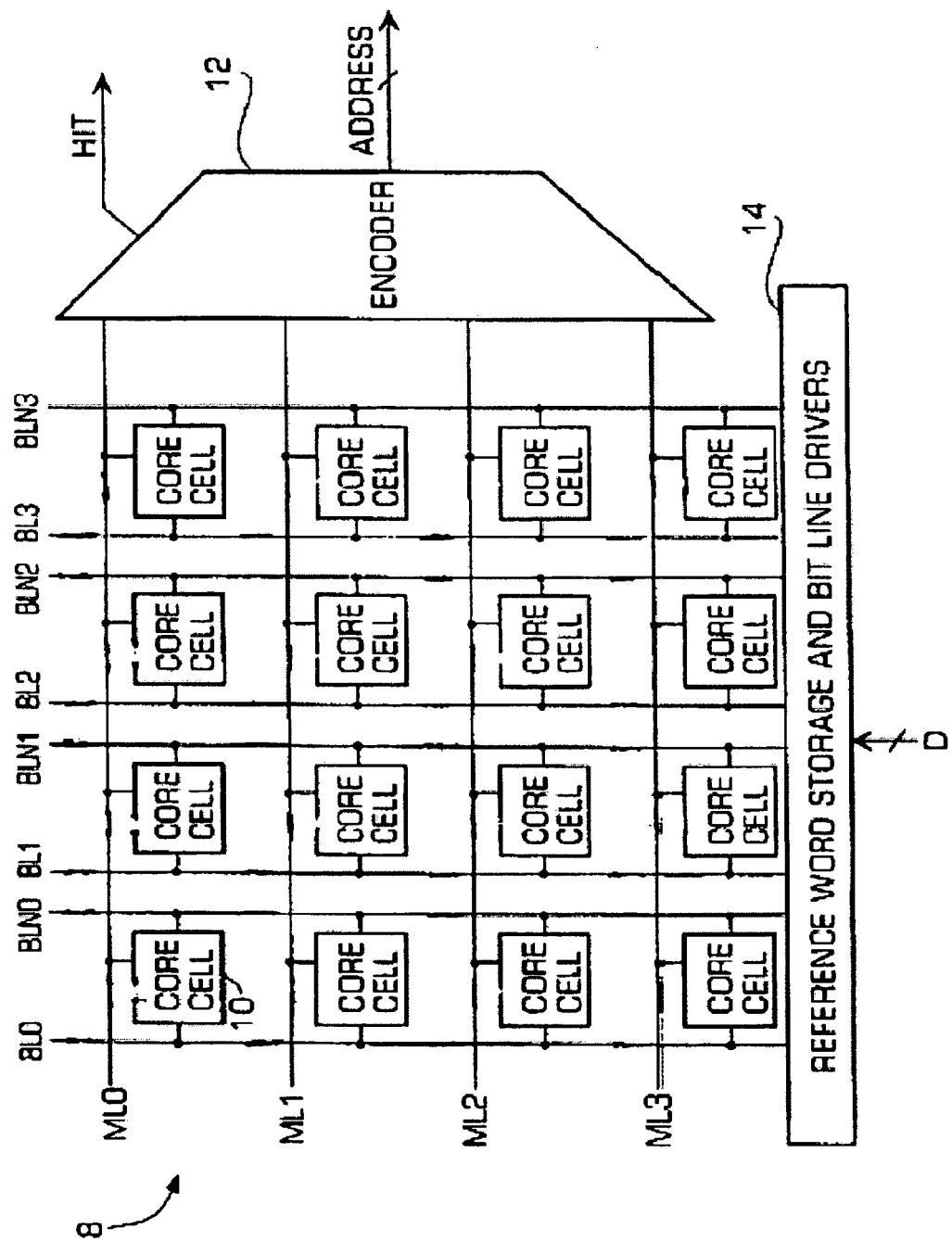
FIG. 1 is a schematic block level diagram of a differential non-volatile content addressable memory array of the present invention using the non-volatile content addressable memory cell of the present invention.

Referring to FIG. 1, there is shown a schematic block level diagram of a differential non-volatile content addressable memory array 8 of the present invention. The array 8 comprises a plurality of non-volatile content addressable memory cells 10 arranged in a plurality of rows and columns. In FIG. 1, the cells 10 are arranged in 4 rows by 4 columns. A match line ML (ML0 . . . ML3) connects all the cells 10 in the same row and to an encoder 12. A pair of differential bit lines (BL0, BLN0 . . . BL3, BLN3) connects all the cells 10 in the same column. The data to which a comparison to determine if a match exists is supplied to the reference word storage and bit line drivers 14. The data is then supplied to the particular column along a pair of particular bit lines. All the match lines (ML0. . .ML3) are connected to the encoder 12. When there is a match as determined by the particular match line going low (or high), the output of the encoder 12 indicates a hit as well as the address of the cell 10 where the match occurred.

Figure 2A:
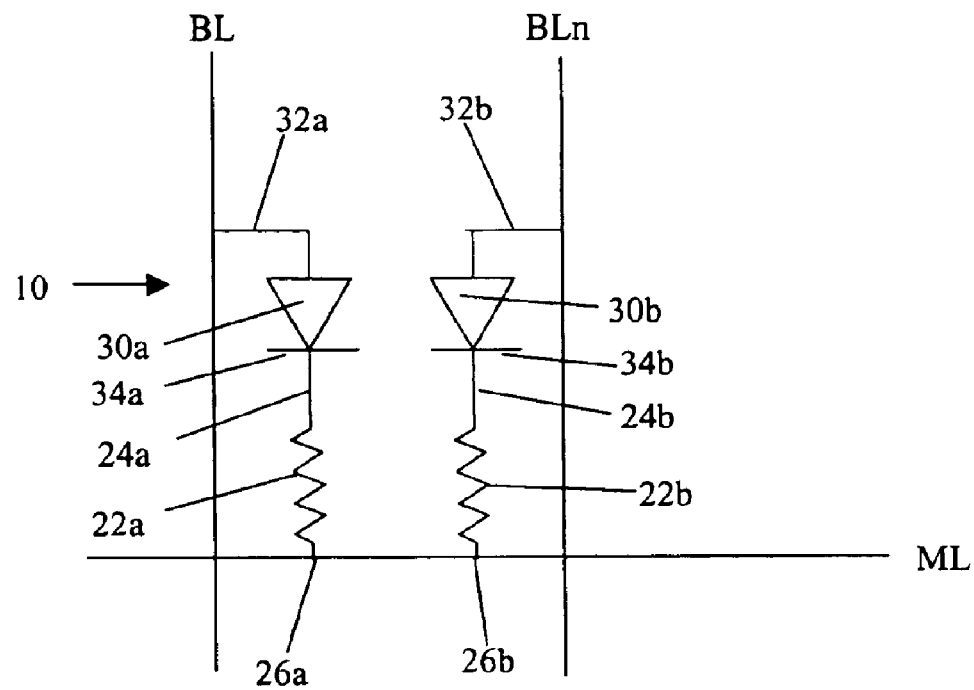
FIG. 2A is a circuit diagram of a first embodiment of a differential non-volatile content addressable memory cell of the present invention which can be used in the array shown in FIG. 1.

Referring to FIG. 2A there is shown a first embodiment of the non-volatile cell 10 that can be used in the array 8 of the present invention. The cell 10 comprises a first storage element 20a comprising of a first phase changing resistor, such as a chalcogenide resistor 22a connected in series with a first diode 30a. The first chalcogenide resistor 22a first end 24a and a second end 26a. The first diode 30a has an anode 32a and a cathode 34a. The anode 32a is connected to one of the bit lines, BL. The cathode 34a is connected to the first end 24a. The second end 26a is connected to the match line ML. The cell 10 also comprises a second storage element 20b comprising of a phase changing resistor, such as a second chalcogenide resistor 22b connected in series with a second diode 30b. The second chalcogenide resistor 22b has a first end 24b and a second end 26b. The second diode 30b has an anode 32b and a cathode 34b. The anode 32b is connected to the other of the bit lines, BLn. The cathode 34b is connected to the first end 24b. The second end 26b is connected to the match line ML.

Figure 2B:
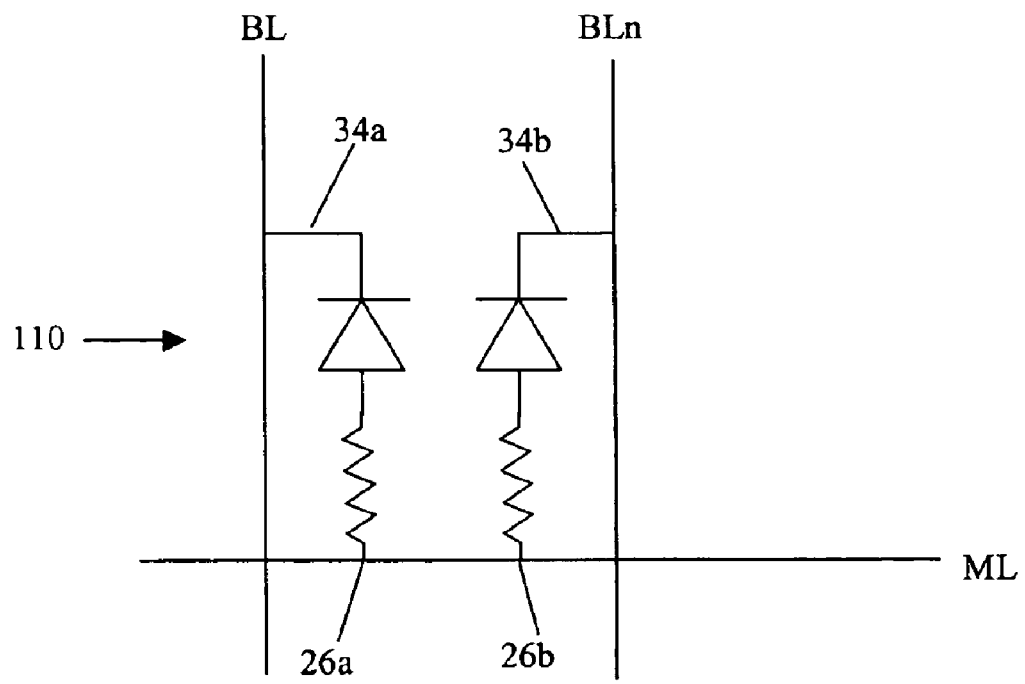
FIG. 2B is a circuit diagram of a second embodiment of a differential non-volatile content addressable memory cell of the present invention which can be used in the array shown in FIG. 1.

Referring to FIG. 2B there is shown a second embodiment of the non-volatile cell 110 that can be used in the array 8 of the present invention. The cell 110 is identical to the cell 10 shown in FIG. 2A except for the connection of the first diode 30a and the second diode 30b. In the second embodiment shown in FIG. 2B, the cathode 34a of the first diode 30a is connected to one of the bit lines, BL. The anode 32a is connected to the first end 24a of the first chalcogenide resistor 22a. The second end 26a is connected to the match line ML. Similarly, the cathode 34b of the second diode 30b is connected to the other of the bit lines, BLn. The anode 32b of the second diode 30b is connected to the first end 24b of the chalcogenide resistor 22b. The second end 26b of the second chalcogenide resistor 22b is connected to the match line ML.

Figure 2C:
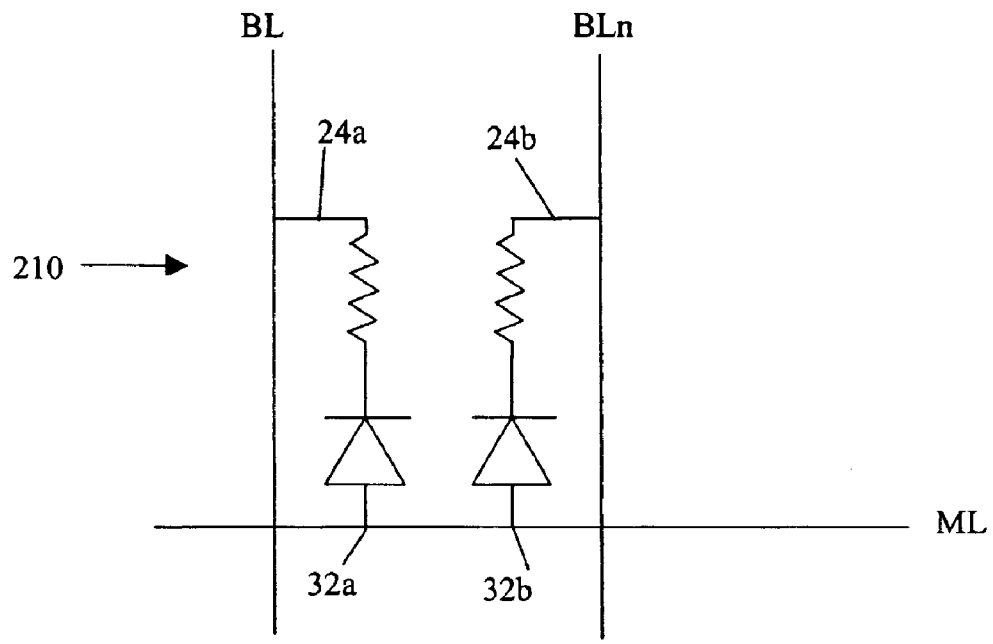
FIG. 2C is a circuit diagram of a third embodiment of a differential non-volatile content addressable memory cell of the present invention which can be used in the array shown in FIG. 1.

Referring to FIG. 2C there is shown a third embodiment of the non-volatile cell 210 that can be used in the array 8 of the present invention. The cell 210 is identical to the cell 10 shown in FIG. 2A and the cell 110 shown in FIG. 2B, except for the connection of the first diode 30a and the second diode 30b. In the third embodiment shown in FIG. 2C, the first end 24a of the first chalcogenide resistor 22a is connected to one of the bit lines, BL. The cathode 34a is connected to the second end 26a of the first chalcogenide resistor 22a. The anode 32a is connected to the match line ML. Similarly, the first end 24b of the second chalgogenide resistor 22b is connected to the other of the bit lines, BLn. The cathode 34b of the second diode 30b is connected to the second end 26b of the second chalcogenide resistor 22b. The anode 32b of the second diode 30b is connected to the match line ML.

Figure 2D:
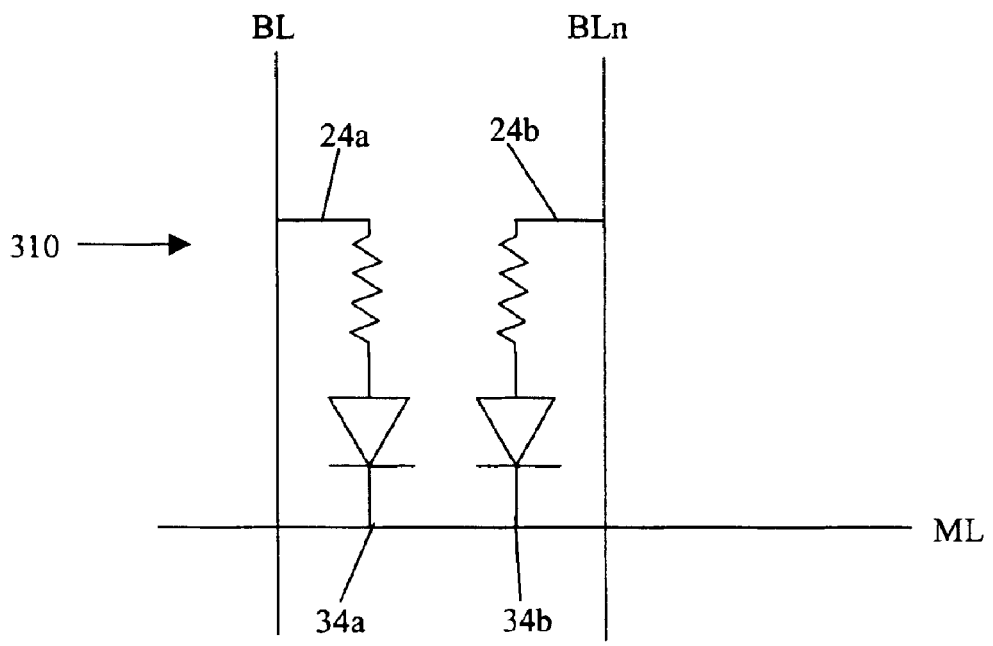
FIG. 2D is a circuit diagram of a fourth embodiment of a differential non-volatile content addressable memory cell of the present invention which can be used in the array shown in FIG. 1.

Referring to FIG. 2D there is shown a fourth embodiment of the non-volatile cell 310 that can be used in the array 8 of the present invention. The cell 310 is identical to the cell 10 shown in FIG. 2A, to the cell 110 shown in FIG. 2B, and to the cell 310 shown in FIG. 2C, except for the connection of the first diode 30a and the second diode 30b. In the fourth embodiment shown in FIG. 2D, the first end 24a of the first chalcogenide resistor 22a is connected to one of the bit lines, BL. The anode 32a is connected to the second end 26a of the first chalcogenide resistor 22a. The cathode 34a is connected to the match line ML. Similarly, the first end 24b of the second chalcogenide resistor 22b is connected to the other of the bit lines, BLn. The anode 32b of the second diode 30b is connected to the second end 26b of the second chalcogenide resistor 22b. The cathode 34b of the second diode 30b is connected to the match line ML.

Each of the memory cells 10, 110, 210 or 310 can be used in the array 8 shown in FIG. 1. To program or reset a cell 10, a first current (e.g. 0.2 mA, if BL is to represent a bit of "1") is placed on the BL line. The BLn line is the inverse of the BL line. Thus, a second current, (e.g. 0.1 mA, if 0.2 mA is on BL) is placed on BLn. Of course, the current and the polarity may differ depending upon the memory cell 10, 110, 210 or 310 used. The match line ML is held at ground. Under this condition, first chalcogenide resistor 22a is programmed, when a current passes through the first chalcogenide resistor 22a, while second chalcogenide resistor 22b remains erased or set, since no current will flow. Once the first chalcogenide resistor 22a is programmed it will have a higher resistance than the second chalcogenide resistor 22b. The resistance of the first chalcogenide resistor 22a or the second chalcogenide resistor 22b "stores" the bit that is programmed therein. The unselected bit lines will all be held at the second current. Similarly, the cell 110 can be programmed by placing a first current, e.g. 0.2 mA, on the match line. If BL has the bit "1", then it is held at the second current or 0.1 mA, and BLn is held at the first current 0.2 mA. First chalcogenide resistor 22a will then be programmed into a higher resistive state. The unselected bit lines will be held at the first current. The cell 210 can be programmed exactly like the cell 110, while the cell 310 can be programmed exactly like the cell 10.

Once the cell 10, 110, or 210, or 310 is programmed, the array 8 operates as follows. The reference word to be compared is first supplied to the reference word storage and bit line drivers 14. Let us assume that the reference word consists of four bits having a bit pattern of 1001. Assuming that the cell 10 is used in the array 8, the current supplied to the various bit lines is as follows:

BL0—first current, e.g. 0.2 mA, since the bit line is supplied with "1".

BLn0—second current, e.g. 0.1 mA, since the bit# line is supplied with "0"

BL1—second current, e.g. 0.1 mA, since the bit line is supplied with "0"

BLn1—first current, e.g. 0.2 mA, since the bit# line is supplied with "1"

BL2—second current, e.g. 0.1 mA, since the bit line is supplied with "0"

BLn2—first current, e.g. 0.2 mA, since the bit# line is supplied with "11"

BL3—first current, e.g. 0.2 mA, since the bit line is supplied with "1".

BLn3—second current, e.g. 0.1 mA, since the bit# line is supplied with "0"

From the foregoing it can be seen that if the chalcogenide resistors 22 of each cell 10 stores a resistance matching exactly as the bit pattern supplied on the bit lines, then little or no current would flow through any of the bit lines. For example, if the chalcogenide resistor 22 connected to bit line BL0 is programmed or reset to store "1", then it is at a high resistive value, and little or no current would therethrough to the match line. For the chalcogenide resistor 22 connected to BLn0, if it is erased or set, thereby storing a "0", the second current supplied to BLn0 would cause little or no current to flow therethrough. As a result, little or no current would flow through all of the bit lines to the match line ML. The testing of the match lines may be one at a time, or by the entire array 8. If the match lines of the array 8 are tested one by one, then the unselected match lines may be held at floating or at the first current (the diodes 30 in the cell 10 would prevent any current flowing from the unselected match line to the bit lines). After the testing of one match line, another match line would be selected for testing. Based upon the foregoing, if there is a mis-match, a current flow would be detected in the match line.

Because the array 8 does not use any word line, it is more compact. Thus, a more compact content addressable memory 8 using differential sensing non-volatile memory elements is provided. In addition, the array 8 is operated at a low operation voltage which is around Vcc, which is lower than the voltage of the non-volatile content addressable memories of the prior art.

What is claimed is:

1. A content addressable memory cell comprising:
a first bit line for supplying a first bit;
a first storage element of a first phase change resistor for storing a first stored bit, connected in series with a first diode; said first storage element connected to said first bit line;
a second bit line for supplying a second bit, said second bit being an inverse of said first bit;
a second storage element of a second phase change resistor for storing a second stored bit, connected in series with a second diode; said second storage element connected to said second bit line; and
a match line connected to said first and second storage elements for indicating whether a match occurred between said first bit and said first stored bit, and between said second bit and said second stored bit.

2. The cell of claim 1 wherein each of said first and second phase change resistor is made of chalcogenide material.

3. The cell of claim 2 wherein each cell is capable of storing one of three possible states:
a first state representing a data bit of "1" wherein the first stored bit represents a bit "1" and the second stored bit represents a bit "0";
a second state representing a data bit of "0" wherein the first stored bit represents a bit "0" and the second stored bit represents a bit "1";

a third state representing a "don't care" state wherein the first stored bit represents a bit "0" and the second stored bit represents a bit "0".

4. The cell of claim 1 wherein said first diode connects said first phase change resistor to said match line; and wherein said second diode connects said second phase change resistor to said match line.

5. The cell of claim 1 wherein said first diode connects said first phase change resistor to said first bit line; and wherein said second diode connects said second phase change resistor to said second bit line.

6. An array of content addressable memory cells comprising:

a plurality of content addressable memory cells arranged in a plurality of rows and columns;

a plurality of pairs of bit lines arranged in columns; each pair of bit lines for supplying a first bit and a second bit with said second bit being an inverse of said first bit; a pair of bit lines being supplied to the cells arranged in the same column;

a plurality of match lines, wherein each match line is connected to the cells arranged in the same row; and wherein each cell comprises:

a first storage element of a first phase change resistor for storing a first stored bit, connected in series with a first diode;

a second storage element of a second phase change resistor for storing a second stored bit, connected in series with a second diode;

wherein the first storage element is connected to an associated match line and to one of a pair of associated bit lines; and wherein each of the second storage element is connected to said associated match line and to another of said pair of associated bit lines.

7. The cell of claim 6 wherein each of said first and second phase change resistors is made of chalcogenide material.

8. The cell of claim 7 wherein each cell is capable of storing one of three possible states:

a first state representing a data bit of "1" wherein the first stored bit represents a bit "1" and the second stored bit represents a bit "0";

a second state representing a data bit of "0" wherein the first stored bit represents a bit "0" and the second stored bit represents a bit "1";

a third state representing a "don't care" state wherein the first stored bit represents a bit "0" and the second stored bit represents a bit "0".

9. The array of claim 6 wherein said first diode connects said first phase change resistor to an associated match line; and wherein said second diode connects said second phase change resistor to said associated match line.

10. The array of claim 6 wherein said first diode connects said first phase change resistor to one of a pair of associated bit lines; and wherein said second diode connects said second phase change resistor to another of said pair of associated bit lines.

* * * * *